United States Patent
Golan

(10) Patent No.: US 9,780,776 B1
(45) Date of Patent: Oct. 3, 2017

(54) POWER DETECTOR CIRCUIT USING NATIVE TRANSISTOR

(71) Applicant: Nuvoton Technology Corporation, Hsin-chu (TW)

(72) Inventor: Tamir Golan, Kibbutz Givat-Chaim Meuchad (IL)

(73) Assignee: NUVOTON TECHNOLOGY CORPORATION, Hsin-chu (TW)

( * ) Notice: Subject to any disclaimer, the term of this patent is extended or adjusted under 35 U.S.C. 154(b) by 0 days.

(21) Appl. No.: 15/339,956

(22) Filed: Nov. 1, 2016

(51) Int. Cl.
*H03L 7/00* (2006.01)
*H03K 17/22* (2006.01)
*G01R 19/165* (2006.01)

(52) U.S. Cl.
CPC ..... *H03K 17/223* (2013.01); *G01R 19/16576* (2013.01)

(58) Field of Classification Search
CPC ............. H03K 17/223; H03K 17/0822; H03K 19/0016; H03K 19/00384; H03K 17/063; H03K 17/20

USPC .................................................. 327/142, 143
See application file for complete search history.

(56) References Cited

U.S. PATENT DOCUMENTS

| | | |
|---|---|---|
| 5,886,549 A | 3/1999 | Naura |
| 6,252,442 B1 | 6/2001 | Malherbe |
| 6,281,723 B1 | 8/2001 | Tailliet |
| 2014/0266314 A1* | 9/2014 | Iriarte .................. H03K 5/2472 327/81 |

* cited by examiner

*Primary Examiner* — Lincoln Donovan
*Assistant Examiner* — Diana J Cheng
(74) *Attorney, Agent, or Firm* — D. Kligler IP Services Ltd.

(57) ABSTRACT

An electronic circuit includes a native N-channel Metal-Oxide-Semiconductor (NMOS) transistor and a P-channel Metal-Oxide-Semiconductor (PMOS) transistor. The gates of the native NMOS transistor and the PMOS transistor and the source of the native NMOS transistor are grounded. The drains of the native NMOS transistor and the PMOS transistors are connected to one another and to an output port, and the source of the PMOS transistor is connected to an input voltage.

8 Claims, 1 Drawing Sheet

POWER DETECTOR CIRCUIT USING NATIVE TRANSISTOR

FIELD OF THE INVENTION

The present invention relates generally to electronic circuitry, and particularly to methods and systems for power or voltage detection.

BACKGROUND OF THE INVENTION

Various types of electronic devices comprise power-detection circuitry, which verifies whether a power-supply voltage level is valid or not. Various power-detection schemes and circuit configurations are known in the art. For example, U.S. Pat. No. 5,886,549, whose disclosure is incorporated herein by reference, describes a device for neutralizing an electronic circuit when the electronic circuit is being powered or disconnected. The neutralizing device comprises a control circuit and a means to inhibit the operation of the electronic circuit, the control circuit activating the inhibiting means so long as a supply voltage remains below a threshold voltage or when the supply voltage goes below said threshold voltage.

U.S. Pat. No. 6,252,442, whose disclosure is incorporated herein by reference, describes a neutralization device for controlling an inhibiting circuit that blocks the operation of an electronic circuit when a supply voltage for the electronic circuit is not sufficient to ensure efficient operation of the electronic circuit.

U.S. Pat. No. 6,281,723, whose disclosure is incorporated herein by reference, describes a checking device for controlling the power-on or power-off operations in an integrated circuit. The device comprises a voltage reference circuit biased by a bias circuit, and an output stage. The device further comprises a control circuit to activate or deactivate the bias circuit as a function of the prevailing mode of operation of the integrated circuit, and a capacitor. A dynamic detection circuit is also associated with a transistor for discharging the capacitor.

SUMMARY OF THE INVENTION

An embodiment of the present invention provides an electronic circuit including a native N-channel Metal-Oxide-Semiconductor (NMOS) transistor and a P-channel Metal-Oxide-Semiconductor (PMOS) transistor. The gates of the native NMOS transistor and the PMOS transistor and the source of the native NMOS transistor are grounded. The drains of the native NMOS transistor and the PMOS transistors are connected to one another and to an output port, and the source of the PMOS transistor is connected to an input voltage.

In some embodiments, the native NMOS transistor and the PMOS transistor are configured to produce at the output port, in response to the input voltage, an output voltage that is substantially zero when the input voltage is below a predefined threshold voltage, and converges to the input voltage when the input voltage exceeds the predefined threshold voltage. In an example embodiment, the native NMOS transistor and the PMOS transistor are configured to produce the output voltage with no additional resistors or capacitors. In an embodiment, the native NMOS transistor has a channel length of at least 2 um. In an embodiment, the PMOS transistor has a channel length of at least 7 um.

There is additionally provided, in accordance with an embodiment of the present invention, an electronic circuit including a power-detection circuit and reset-generation circuitry. The power-detection circuit includes a native N-channel Metal-Oxide-Semiconductor (NMOS) transistor and a P-channel Metal-Oxide-Semiconductor (PMOS) transistor. The gates of the native NMOS transistor and the PMOS transistor and the source of the native NMOS transistor are grounded, the drains of the native NMOS transistor and the PMOS transistors are connected to one another and to an output port, and the source of the PMOS transistor is connected to an input voltage. The reset-generation circuitry is configured to generate a reset signal responsively to an output voltage produced on the output port by the power-detection circuit.

There is also provided, in accordance with an embodiment of the present invention, a method including applying an input voltage to a power-detection circuit, which includes a native N-channel Metal-Oxide-Semiconductor (NMOS) transistor and a P-channel Metal-Oxide-Semiconductor (PMOS) transistor. The gates of the native NMOS transistor and the PMOS transistor and the source of the native NMOS transistor are grounded, the drains of the native NMOS transistor and the PMOS transistors are connected to one another and to an output port, and the source of the PMOS transistor is connected to the input voltage. A decision is made, depending on an output voltage produced on the output port, whether the input voltage is valid.

There is further provided, in accordance with an embodiment of the present invention, a method including connecting the gates of a native N-channel Metal-Oxide-Semiconductor (NMOS) transistor and a P-channel Metal-Oxide-Semiconductor (PMOS) transistor, and the source of the native NMOS transistor, to ground. The drains of the native NMOS transistor and the PMOS transistors are connected to one another and to an output port. The source of the PMOS transistor is connected to an input voltage port.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved power-detection circuits and associated methods. In the disclosed embodiments, a power-detection circuit comprises a native N-channel Metal-Oxide-Semiconductor (NMOS) transistor and a P-channel Metal-Oxide-Semiconductor (PMOS) transistor. The transistors are connected such that (i) the gates of the two transistors, and the source of the native NMOS transistor, are grounded, (ii) the source of the PMOS transistor is connected to an input voltage (VCC), and (iii) the drains of the two transistors are connected to one another and to an output port on which an output voltage is provided.

This circuit configuration generates an output voltage that (i) remains substantially zero as long as the input voltage (VCC) is below a predefined threshold voltage, and (ii)

converges rapidly to the input voltage when the input voltage exceeds the threshold voltage. The threshold voltage is determined by the threshold voltage of the PMOS transistor.

The disclosed circuit can be used, for example, for driving reset-generation circuitry in order to generate a reset signal for an electronic circuit. Since the output voltage of the power-generation circuit remains zero until the input voltage exceeds the threshold voltage, the reset-generation circuitry will not generate the reset signal in the initial stages of power-up, while the input voltage is still unstable. As a result, the reset signal is highly reliable.

The native NMOS transistor and the PMOS transistors are typically chosen to have large channel length ("large-L") in order to reduce leakage current when in cutoff.

The resulting power-detection circuit is physically small and has very low current consumption. In some embodiments, the power-detection circuit comprises only the two transistors, with no additional resistors or capacitors, and can therefore be implemented on a very small die area. The disclosed circuit configuration lends itself to straightforward fabrication using conventional Complementary Metal Oxide Semiconductor (CMOS) processes. Moreover, since the disclosed configuration does not rely on any accurate reference voltages, the power-detection circuit is highly robust and does not require accurate tolerances or calibration.

System Description

Figure 1:
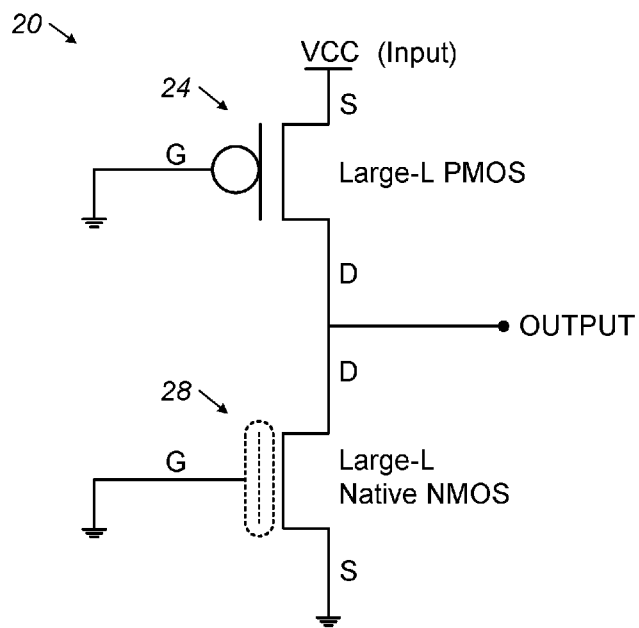
FIG. 1 is a circuit diagram of a power-detection circuit, in accordance with an embodiment of the present invention.
Figure 2:
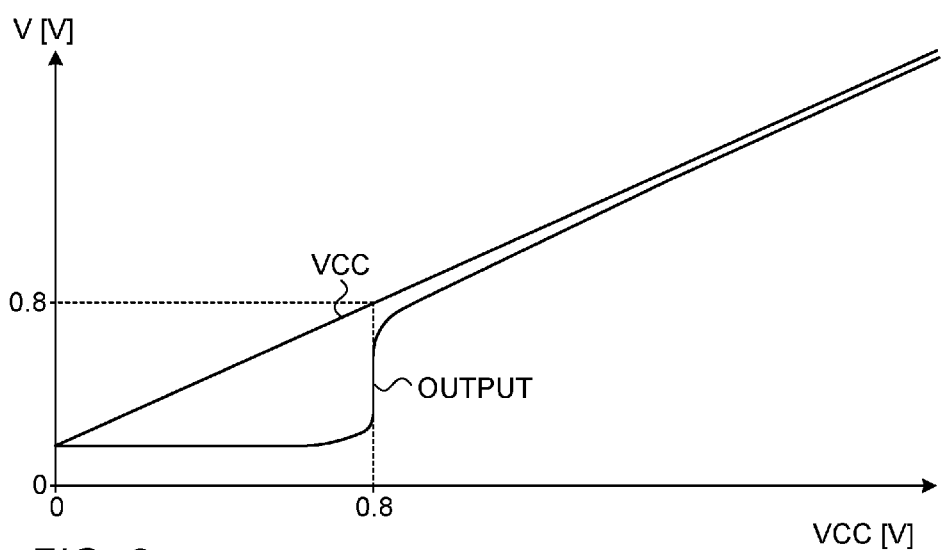
FIG. 2 is a graph showing simulated performance of the power-detection circuit of FIG. 1, in accordance with an embodiment of the present invention.

FIG. 1 is a circuit diagram of a power-detection circuit 20, in accordance with an embodiment of the present invention. Circuit 20 receives a supply voltage denoted VCC as input, and produces an output voltage denoted OUTPUT. Circuit 20 generates the output voltage so as to (i) remain substantially zero as long as VCC is below some predefined threshold voltage, and (ii) converge rapidly to VCC when VCC exceeds the predefined threshold voltage (the threshold voltage of a PMOS transistor—addressed below). A simulated characteristic relationship between the output voltage and VCC is depicted in FIG. 2 below. In the embodiments described herein the threshold voltage is 0.8 Volts. Alternatively, however, other suitable threshold voltages can also be used.

In the example of FIG. 1, circuit 20 comprises two Metal-Oxide-Semiconductor (MOS) Field-Effect Transistors (FETs)—A P-channel MOS (PMOS) transistor 24 and a native N-channel MOS (NMOS) transistor 28. The terms "P-channel" and "P-type" are used interchangeably herein, and so are the terms "N-channel" and "N-type". Each of the transistors has respective gate (G), source (S) and drain (D) terminals.

The term "native transistor" refers to a transistor that is in a conduction state (between its source and drain), as opposed to a cutoff state, even when the voltage between the gate and source (Vgs) is zero. The source-drain current increases monotonically as a function of Vgs. A native N-type transistor typically goes into cutoff state when its Vgs drops below 0V. A P-type transistor typically goes into cutoff state when its Vgs drops below 0.7V.

In the present example, PMOS transistor 24 and native NMOS transistor 28 are connected as follows:

The gates (G) of native NMOS transistor 28 and PMOS transistor 24, as well as the source (S) of native NMOS transistor 28, are connected to ground.

The drains (D) of native NMOS transistor 28 and PMOS transistor 24 are connected to one another and to an output port on which the OUTPUT voltage is provided.

The source (S) of PMOS transistor 24 is connected to the input voltage VCC.

In some embodiments, both PMOS transistor 24 and native NMOS transistor 28 are large-channel ("large-L") transistors. In an example embodiment, the channel length of PMOS transistor 24 is at least 7 um, and the channel length of native NMOS transistor 28 is at least 2 um. The large channel length helps to reduce leakage current in the active state, when VCC reaches its nominal value. The values given above are chosen by way of example, and any other suitable values can be used in alternative embodiments.

The circuit configuration of FIG. 1 is an example configuration that is chosen for the sake of conceptual clarity. In alternative embodiments, any other suitable configuration can be used. In some embodiments, circuit 20 is fabricated using a conventional Complementary Metal Oxide Semiconductor (CMOS) process, possibly together with the rest of the electronic circuit in which it is embedded. For example, circuit 20 may be fabricated together with the reset-generation circuitry it drives in an IC, using a conventional CMOS fabrication process. Native NMOS transistors that are suitable for serving as transistor 28 are typically available in various CMOS processes.

Circuit 20 can be used for various purposes in various types of electronic devices. For example, circuit can be used for driving digital circuitry that generates a reset signal in a power-up sequence of an electronic circuit, e.g., an Integrated Circuit (IC). In this example, the electronic circuit comprises a power-detection circuit such as circuit 20, and reset-generation circuitry that generates a reset signal in response to the OUTPUT voltage produced by the power-detection circuit. The power-detection circuit monitors the power supply (VCC) of the electronic circuit during power-up, and causes the reset-generation circuitry to generate the reset signal only when VCC increases above the threshold voltage. As long as VCC is below the threshold voltage, it is regarded as non-stabilized, and should therefore not trigger a reset.

FIG. 2 is a graph showing simulated performance of power-detection circuit 20 of FIG. 1, in accordance with an embodiment of the present invention. The graph shows the dependence of the output voltage (OUTPUT) on the input voltage (VCC). As can be seen in the figure, the output voltage remains substantially zero for small values of VCC, up to a threshold voltage of approximately 0.8 Volts. When VCC reaches and exceeds this threshold voltage, the output voltage rises rapidly and converges to VCC. In the example circuit of FIG. 1, the threshold voltage is determined by the threshold voltage of PMOS transistor 24.

Although the embodiments described herein mainly address reset-signal generation circuitry, the methods and systems described herein can also be used in other applications, such as in free-running oscillator turn-on circuitry.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic circuit, comprising:
   a native N-channel Metal-Oxide-Semiconductor (NMOS) transistor; and
   a P-channel Metal-Oxide-Semiconductor (PMOS) transistor,
   wherein a gate of the PMOS transistor is grounded, wherein a gate and a source of the native NMOS transistor are connected directly to one another and to ground, wherein drains of the native NMOS transistor and the PMOS transistor are connected to one another and to an output port, and wherein a source of the PMOS transistor is connected to an input voltage.

2. The circuit according to claim 1, wherein the native NMOS transistor and the PMOS transistor are configured to produce at the output port, in response to the input voltage, an output voltage that is substantially zero when the input voltage is below a predefined threshold voltage, and converges to the input voltage when the input voltage exceeds the predefined threshold voltage.

3. The circuit according to claim 2, wherein the native NMOS transistor and the PMOS transistor are configured to produce the output voltage with no additional resistors or capacitors.

4. The circuit according to claim 1, wherein the native NMOS transistor has a channel length of at least 2 um.

5. The circuit according to claim 1, wherein the PMOS transistor has a channel length of at least 7 um.

6. An electronic circuit, comprising:
   a power-detection circuit, comprising:
      a native N-channel Metal-Oxide-Semiconductor (NMOS) transistor; and
      a P-channel Metal-Oxide-Semiconductor (PMOS) transistor,
      wherein a gate of the PMOS transistor is grounded, wherein a gate and a source of the native NMOS transistor are connected directly to one another and to ground, wherein drains of the native NMOS transistor and the PMOS transistor are connected to one another and to an output port, and wherein a source of the PMOS transistor is connected to an input voltage; and
   reset-generation circuitry, configured to generate a reset signal responsively to an output voltage produced on the output port by the power-detection circuit.

7. A method, comprising:
   applying an input voltage to a power-detection circuit, which comprises a native N-channel Metal-Oxide-Semiconductor (NMOS) transistor and a P-channel Metal-Oxide-Semiconductor (PMOS) transistor, wherein a gate of the PMOS transistor is grounded, wherein a gate and a source of the native NMOS transistor are connected directly to one another and to ground, wherein drains of the native NMOS transistor and the PMOS transistor are connected to one another and to an output port, and wherein a source of the PMOS transistor is connected to the input voltage; and
   deciding, depending on an output voltage produced on the output port, whether the input voltage is valid.

8. A method, comprising:
   connecting a gate of a P-channel Metal-Oxide-Semiconductor (PMOS) transistor to ground;
   connecting a gate and a source of a native N-channel Metal-Oxide-Semiconductor (NMOS) transistor directly to one another and to ground;
   connecting drains of the native NMOS transistor and the PMOS transistor to one another and to an output port; and
   connecting a source of the PMOS transistor to an input voltage port.

* * * * *